United States Patent [19]

McAllister et al.

[11] Patent Number: 4,909,901

[45] Date of Patent: Mar. 20, 1990

[54] EMI AND RFI SHIELDING AND ANTISTATIC MATERIALS AND PROCESSES FOR PRODUCING THE SAME

[75] Inventors: Richard G. McAllister, Sterling; Lawrence E. McEnroe, III, Westminster, both of Mass.

[73] Assignee: James River Corporation, Richmond, Va.

[21] Appl. No.: 101,938

[22] Filed: Sep. 28, 1987

[51] Int. Cl.$^4$ ............................................. D21H 1/02
[52] U.S. Cl. .................................... 162/125; 162/128; 162/129; 162/135; 162/138; 162/146; 162/181.8; 206/328; 206/524.2; 206/524.3; 206/524.4; 427/121; 428/449; 428/452; 428/535; 428/537.7
[58] Field of Search ............... 162/125, 129, 138, 135, 162/181.8, 128, 146; 206/328, 524.2, 524.3, 524.4; 428/449, 452, 535, 537.7; 427/121

[56] References Cited

U.S. PATENT DOCUMENTS

| | | | |
|---|---|---|---|
| 3,048,515 | 8/1962 | Dalton | 162/138 |
| 3,367,851 | 2/1968 | Filreis et al. | 162/138 |
| 3,653,894 | 4/1972 | Levy et al. | 162/138 |
| 4,532,099 | 7/1985 | Kaji | 206/328 |
| 4,606,790 | 8/1986 | Youngs et al. | 162/138 |
| 4,645,566 | 2/1987 | Kato et al. | 162/138 |
| 4,658,958 | 4/1987 | McNulty et al. | 206/328 |
| 4,711,702 | 12/1987 | Hood | 162/138 |
| 4,728,395 | 3/1988 | Boyd | 162/138 |

*Primary Examiner*—Peter Chin
*Attorney, Agent, or Firm*—Finnegan, Henderson, Farabow, Garrett & Dunner

[57] ABSTRACT

The present invention provides a multilayer fibrous material suitable for use as an EMI and RFI shielding packaging material and a process for producing the same comprising first and second outer layers formed of paper or paperboard and an inner layer formed of paper or paperboard containing conductive carbon. The invention also provides a method of providing antistatic properties to the packaging material.

13 Claims, No Drawings

EMI AND RFI SHIELDING AND ANTISTATIC MATERIALS AND PROCESSES FOR PRODUCING THE SAME

FIELD OF THE INVENTION

The present invention relates generally to a multilayer fibrous material and a process for producing the same. More particularly, the invention relates to an EMI and RFI shielding material which, if desired, may also be made antistatic or static dissipative. This material is useful in packaging for electronic components.

BACKGROUND OF THE INVENTION

Electronic components can be damaged by exposure to electric fields such as EMI, RFI, and static electric fields. Various packaging materials have been developed to protect electronic components from these fields.

An EMI/RFI shielded two part container is disclosed in U.S. Pat. No. 4,609,104 to Kasper et al. The container comprises a sleeve having a continuous layer of a conductive metal on the inner side thereof and a transporter which slides into the sleeve and contains a continuous layer of a conductive metal on its inner surface. The transporter has at least one tab foldable outwardly to bring the metallic layer of the transporter into contact with the metallic layer of the sleeve as the transporter is slid into the sleeve.

U.S. Pat. No. 4,658,958 to McNulty et al. provides an optically transparent and flexible laminated article for packaging electronic components which provides EMI and RFI shielding and electrostatic dissipation. The article comprises a fibrous mat of woven or non-woven electrically conductive carbon fibers disposed between outer layers of polymeric material, generally low density polyethylene.

A static shielded shipping container is disclosed in U.S. Pat. No. 4,480,747 to Kazor et al. This container comprises two separable container portions, each coated on one side with a conductive layer. the portions engage so that the upper portion slides over the lower portion bringing the two conductive layers into electrical contact whereby the objects placed within the container are completely surrounded by a conductive cage. The conductive coating is exposed on the bottom surface of the assembled container to insure that the conductive cage is grounded to any conductive object on which the container is placed.

An electronically conductive container for grounding circuit boards and similar planar objects is disclosed in U.S. Pat. No. 4,308,953 to Cohen. The container comprises a container member, preferably formed from cardboard material, having an interior wall onto which electrically conductive holding panels having a plurality of slots therein are arranged to hold the planar objects placed in the container. The conductive coating may, for example, be carbon black or graphite impregnated paper. A portion of the exterior wall surface of the container member is electrically conductive, and electrically conductive means are provided for electrically connecting the holding panels to the exterior portion of the container member.

It has also been known to use montmorillonite clay to provide an electroconductive coating on paper to make a copy sheet for electrophotography as disclosed in U.S. Pat. No. 3,639,162 to Bixler.

SUMMARY OF THE INVENTION

The present invention advances the state of the art by providing an inexpensive multilayer fibrous material.

The multilayer fibrous material of the present invention is suitable for use in protecting electronic components from EMI and RFI fields.

A further feature of the invention is to provide a fibrous material which in addition to providing EMI and RFI shielding is also antistatic or static dissipative.

Still another feature of the invention is to provide a process for producing the EMI, RFI and antistatic shielding fibrous material in an economical and simple manner.

To achieve these features and in accordance with a first embodiment of the invention, there is provided a multilayer fibrous material which provides EMI and RFI shielding comprising (1) a first outer layer formed of paper or paperboard; (2) an inner layer formed of paper or paperboard containing conductive carbon fibers in an amount necessay to achieve the desired EMI and RFI shielding effect, and (3) a second outer layer formed of paper or paperboard.

There is also provided a process for producing the above-described multilayer fibrous material. Specifically, in a conventional multi-step paper-making process an additional step is employed. A dispersion of cellulose and carbon fibers is prepared and agitated with a minimum of hear to prevent breakage of the carbon fibers. The dispersion is then metered to form a mixture with additional cellulose, sad mixture being used to form the inner layer. The outer layers and the inner layer are formed on a conventional wet process paper making machine using conventional wet process paper making techniques and superimposed upon each other.

There is also provided a multilayer fibrous material which provides EMI and RFI shielding and further provides antistatic or static dissipative properties comprising (1) a first outer layer formed of paper or paperboard; (2) an inner layer formed of paper or paperboard containing conductive carbon fibers in an amount necessary to achieve the desired EMI and RFI shielding effect and (3) a second layer formed of paper or paperboard, each of said first and second outer layers having an external and internal surface, and said external surfaces of said outer layers being coated with a film of a montmorillonite or bentonite clay in an amount necessary to achieve the desired antistatic or static dissipative effect.

There is also provided process for producing the above-described multilayer fibrous material which provides EMI and RFI shielding and also has antistatic and/or static dissipative properties by the use of inert clays such as montmorillonite and bentonite clays which have antistatic and static dissipative properties. These clays are inorganic and they will not "out-gas", i.e., generate corrosive vapors as do, for example, quaternary ammonium compounds when heated to decomposition temperature.

Accordingly, the multilayer fibrous material of the present invention, when used to package electronic components, will provide EMI, RFI and antistatic shielding and advantageously will not emit any corrosive gases that may damage electronic components.

In order to render the multilayer fibrous material antistatic or static dissipative, the clay is applied to the external surfaces of the first and second outer layers after formation of the material as previously described.

A dispersion of the clay is prepared and the dispersion may be applied by any conventional paper making coating process such as for example meyer rod, size press, reverse roll, gravure, or blade coating.

Additional features and advantages of the invention will be set forth in the description that follows, and in part will be apparent from the description, or may be learned by practice of the invention. The features and advantages of the invention may be realized and obtained by means of the instrumentalities and combinations particularly pointed out in the appended claims.

The foregoing and other features and advantages of the present invention will be made more apparent from the following description of the preferred embodiments of the invention.

DETAILED DESCRIPTION OF THE PREFERRED EMBODIMENTS

Reference will now be made to the preferred embodiments of the invention.

In the process of making the multilayer fibrous material of the invention it is preferable to employ a wet process paper making machine having three vats.

In the process of making the multilayer fibrous material of the invention it is preferable to prepare a dispersion containing cellulose and 1-2% by weight of $\frac{1}{4}$ inch to $\frac{1}{2}$ inch carbon fibers such as, for example, Carboflex which is manufactured by the Ashland Oil Company.

The amount of carbon fibers contained in the inner layer of the material is determined by the rate at which the cellulose and carbon fiber dispersion is metered to prepare the mixture which is used to form said inner layer. For example, if about 10 decibels of shielding are desired, 8 to 10% by weight of the carbon fibers should be metered into the mixture. If from about 20 to about 30 decibels of shielding are desired, 15-20% by weight of carbon fibers should be metered into the mixture. The carbon contained in the inner layer of the packaging material provides conductive properties. One skilled in the art can readily determine, without undue experimentation, the appropriate rate at which to meter the dispersion to prepare the mixture which is used to form the inner layer to obtain the desired shielding effect.

When it is desirable to make the material of the invention antistatic or static dissipative, montmorillonite or bentonite clay or another natural or synthetic zeolite material is preferably employed in a 1 to 10% by weight dispersion and applied to the external surfaces of the first and second paper or paperboard outer layers by a conventional coating process. Preferably, the clay dispersion is applied to said first and second outer layers in an amount such that the layers contain from 0.5 to 5% by weight of the montmorillonite clay on a dry or active basis. An exemplary suitable montmorillonite clay is Van Gel B, sold by R. T. Vanderbilt Company. It has been found that films cast from 10% dispersions of Van Gel B lower the surface conductivity of the material of the invention from $10^{13}$ Ohms per square to from $10^9$ to $10^6$ Ohms per square. This clay is also self-adhering and requires no binders which are required in Kaolin based systems.

Preferably, the surface conductivity of the first and second outer layers of the material is from about $10^9$ to $10^6$ Ohms per square, and the surface conductivity of the inner layer is no greater than $10^4$ Ohms per square.

The montmorillonite or bentonite clay may also be present in each layer of the material of the invention if greater static dissipation is desired. In this case the clay is added to the cellulose and water dispersion in the beginning of the papermaking process. Preferably, the clay is added to the cellulose and water dispersion in an amount from about 2 to 15% by weight. After completion of the papermaking process the external surfaces of the first and second outer layers should be coated with montmorillonite or bentonite clay by a conventional coating process as previously described herein.

The invention will be further clarified by the following example, which is intended to be merely illustrative of the present invention.

EXAMPLE 1

A multilayer fibrous material was prepared having the following composite structure. The inner layer was formed from a carbon fiber/cellulose blend containing from 20 to 30% by weight of $\frac{1}{2}$ inch carbon fibers. This inner layer showed a surface conductivity of from $10^0$ to $10^2$ Ohms per square and provided a significant degree of EMI shielding.

The first and second outer layers were formed from a cellulose blend containing montmorillonite clay in an amount sufficient to eliminate the capacitor effect between the outer layers and the inner layer. These outer layers had a surface conductivity of $10^{10}$ Ohms per square.

The external surfaces of the outer layers were coated with a #24 meyer rod coating of Van Gel B from a 10% aqueous dispersion. These coatings had a surface conductivity of $10^8$ Ohms per square.

Other embodiments of the invention will be apparent to those skilled in the art from consideration of the specification and practice of the invention disclosed therein. It is intended that the specification be considered as exemplary only, with the true scope and spirit to the invention being indicated by the following claims.

What is claimed is:

1. A multilayer fibrous material comprising a first outer layer, an inner layer and a second outer layer, said first and second outer layers formed of cellulose filter paper or paperboard and containing from about 0.05 to about 5% by weight of an inert clay having antistatic or static dissipation; and said inner layer formed of paper or paperboard containing cellulose fibers and conductive carbon fibers in an amount necessary to achieve the desired EMI and RFI shielding effect.

2. The material o claim 1 wherein said inner layer contains carbon fibers in an amount of from about 3 to 25% by weight.

3. The material of claim 1 wherein each of said first and second outer layers has an external and an internal surface, and said external surfaces of said outer layers are coated with a film of said inert clay in an amount necessary to achieve a desired antistatic or static dissipative effect.

4. The material of claim 3 wherein said clay is selected from the group consisting of montmorillonite clay and bentonite clay, or other natural or synthetic zeolite materials.

5. The material of claim 3 wherein said film is prepared from a 1 to 10% by weight dispersion of said montmorillonite clay.

6. A multilayer fibrous material which provides EMI and RFI shielding and further provides antistatic or static dissipative properties comprising a first outer layer, an inner layer and a second outer layer, said first and second outer layers formed of cellulose fiber paper or paperboard containing an inert clay having antistatic or static dissipative effect, and said inner layer formed of paper or paperboard containing cellulose fibers an inert clay having antistatic or static dissipative effect and conductive carbon fibers in an amount necessary to achieve the desired EMI and RFI shielding effect; each of said first and second outer layers having an external and internal surface, and said external surfaces of said outer layers being coated with a film or an inert clay having antistatic or static dissipative effect in amount necessary to achieve the desired antistatic or static dissipative effect.

7. The material of claim 6 wherein said inner layer contains carbon fibers in an amount of from about 3 to 25% by weight.

8. The material of claim 6 wherein said clay is selected from the group consisting of montmorillonite clay and bentonite clay or other natural or synthetic zeolite materials.

9. The material of claim 6 wherein said film is prepared from a 10% by weight dispersion of said montmorillonite clay.

10. The material of claim 6 wherein said first and second outer layers each contains from about 0.5 to about 5% by weight of said montmorillonite clay on a dry or active basis.

11. A multilayer fibrous material comprising a first outer layer, an inner layer and a second outer layer, said first and second outer layers formed of cellulose fiber paper or paperboard; and said inner layer formed of paper or paperboard containing cellulose fibers and conductive carbon fibers in an amount necessary to achieve the desired EMI and RFI shielding effect wherein each of said first and second outer layers has an external and an internal surface, and said external surfaces of said outer layers are coated with a film of an inert clay having antistatic or static dissipative effect in an amount necessary to achieve a desired antistatic or static dissipative effect.

12. A process for preparing a cellulosic packaging material having EMI and RFI shielding properties and antistatic or static dissipative properties comprising:
 a. forming an aqueous dispersion of cellulose fibers and carbon fibers;
 b. metering said dispersion with additional cellulose to form on a paper making machine an inner layer having two surfaces;
 c. superimposing outer layers of cellulose fibers formed on a paper-making machine on each of said surfaces to form a multilayer fibrous material, said outer layers having internal and external surfaces; and
 d. coating said outer layer external surfaces with an inert clay having antistatic or static dissipative effect.

13. A process according to claim 12 where said outer layers are formed from a dispersion of cellulose and an inert clay having antistatic or static dissipative effect.

* * * * *

UNITED STATES PATENT AND TRADEMARK OFFICE
CERTIFICATE OF CORRECTION

PATENT NO. : 4,909,901

DATED : March 20, 1990

INVENTOR(S) : McAllister et al.

It is certified that error appears in the above-identified patent and that said Letters Patent is hereby corrected as shown below:

In column 4, line 40, "filter" should be --fiber--;
col. 4, line 43, "dissipation" should be --dissipative effect--.

In column 4, line 47, "o" should be "of".

In column 5, line 2, "fibers" should be followed by --,--.

Signed and Sealed this

Thirtieth Day of July, 1991

Attest:

HARRY F. MANBECK, JR.

Attesting Officer

Commissioner of Patents and Trademarks